May 9, 1961 M. V. HOOVER 2,983,882

PULSED AMPLIFIERS WITH PULSED BIAS CONTROL

Filed March 23, 1959

INVENTOR.
MERLE V. HOOVER
BY J. L. Whittaker
ATTORNEY 2,983,882

PULSED AMPLIFIERS WITH PULSED BIAS CONTROL

Merle V. Hoover, Lancaster, Pa., assignor to Radio Corporation of America, a corporation of Delaware Filed Mar. 23, 1959, Ser. No. 801,300

4 Claims. (Cl. 332—49)

The present invention relates generally to vacuum tube circuits and more particularly to improved pulsed amplifier circuits.

High power pulsed amplifiers are found in such low duty cycle applications as radar transmitters, shoran and loran transmitters and the like, where short duration, high power pulses of radio frequency energy are required. Relatively small vacuum tubes can be used in such amplifiers without exceeding the tube ratings. To do this however, it is necessary that very high voltage pulses be applied to the tubes. One difficulty which then arises is that the high voltage pulses often cause interelectrode voltage breakdown and flash arcing between tube electrodes.

When flash arcing occurs, the tubes are often damaged, resulting in equipment failures and costly maintenance problems. Thus, any tendency towards flash arcing should be eliminated or reduced in order to improve equipment reliability. Equipment reliability may also be further improved by designing amplifier circuits having a reduced number of components, thereby reducing the probability of a component failure.

Accordingly, it is a general object of the present invention to provide improved pulsed amplifiers.

A further object of the present invention is to minimize the possibility of interelectrode voltage breakdown in high power amplifiers.

Another object is to provide improved pulsed amplifiers utilizing multigrid tubes.

Still another object is to provide improved pulsed amplifiers having simplified circuitry and improved reliability.

These and other objects and advantages are achieved in accordance with the present invention in a pulsed radio-frequency amplifier circuit utilizing a vacuum tube having a plate, a control grid and a screen grid electrode, in which a radio frequency carrier signal is applied to the control grid electrode, and pulse type operating voltages are simultaneously applied to the plate, control grid and screen grid electrodes.

Figure 2:
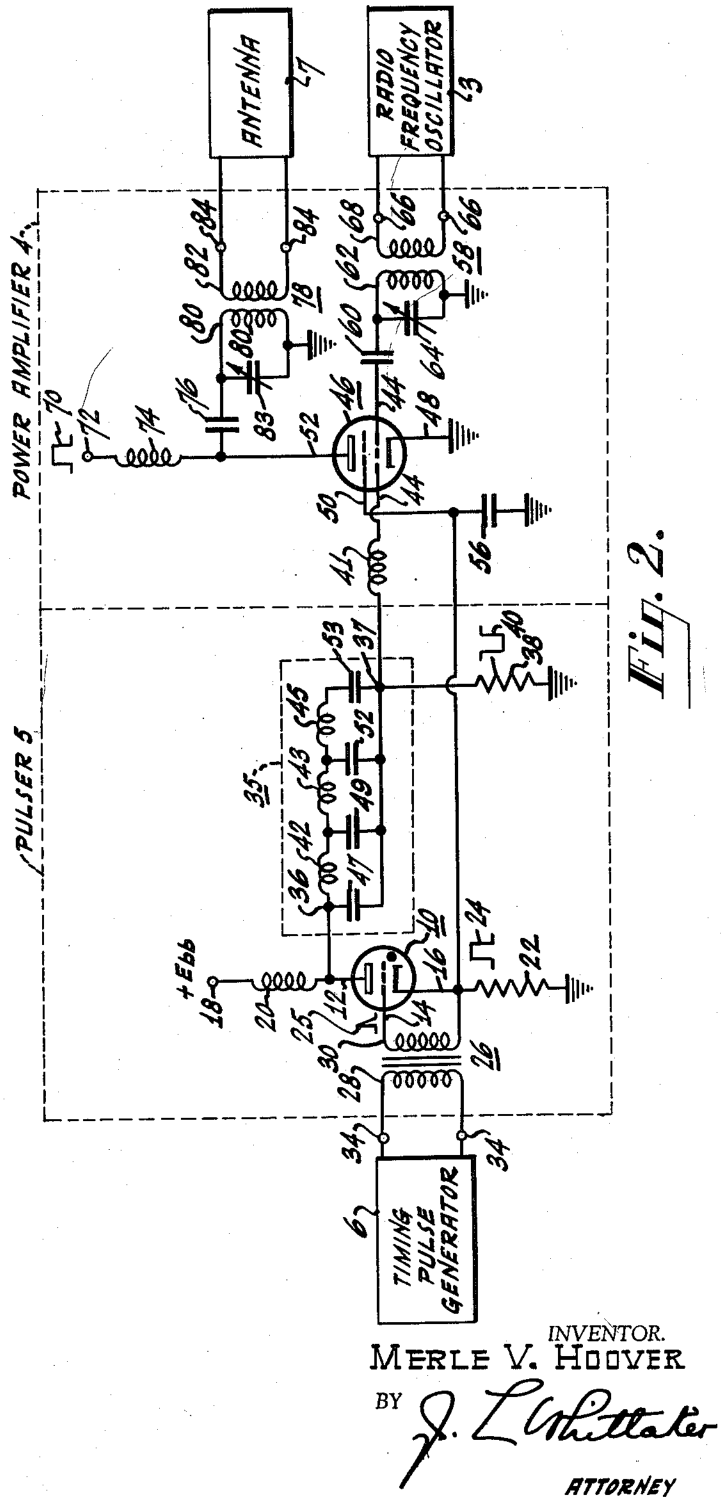
Figure 1:
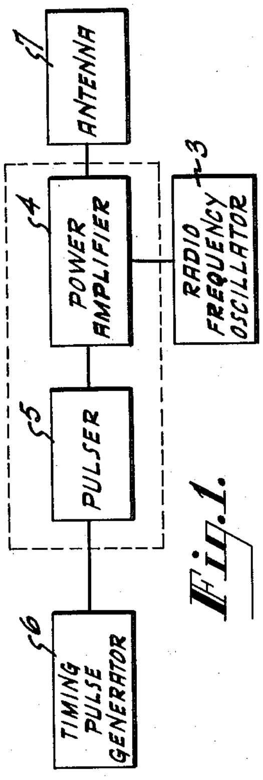

The invention and a characteristic embodiment thereof will be described in greater detail by reference to the accompanying drawings wherein:

Figure 1 is a block diagram of a transmitting system in which the present invention may be utilized; and, Figure 2 is a schematic circuit diagram of a tetrode power amplifier and a pulser connected therewith in accordance with the invention.

Figure 1 shows a block diagram of a transmitting system such as may be used in a radar transmitter, for example, and in which the present invention may be utilized. The transmitting system comprises a radio-frequency oscillator 3 driving a power amplifier 4. The power amplifier 4 is in turn controlled by a pulser 5 in such a manner that the power amplifier is operative only when it is supplied operating potentials by the pulser. In this way the system may generate radio-frequency pulses of high power but of relatively short duration.

The pulse repetition rate is determined by a pulse time generator 6, which may be a conventional oscillator, connected with the pulse 5 and delivering triggering pulses thereto. The output of the power amplifier is applied to an antenna 7 in any well-known manner. The portion of Figure 1 enclosed in dotted lines is shown in detail in Figure 2.

In Figure 2, a circuit diagram of a tetrode power amplifier and a pulser is shown in accordance with the invention. The pulser includes a thyratron type tube 10 having a plate 12, control grid 14 and cathode 16. Operating plate voltage $+E_{bb}$ for the thyratron 10 is applied to a terminal 18 which is connected to the anode 12 through a charging choke 20. The cathode 16 is connected to ground through a resistor 22 across which a positive voltage pulse 24 is derived when the thyratron is triggered into conduction. A triggering signal 25 is applied between the grid 14 and the cathode 16 by an input transformer 26, which includes a primary winding 28 and a secondary winding 30. The secondary winding 30 is connected between the grid 14 and the cathode 16. It is to be noted that positive driving or triggering signals are always required for a thyratron. The driving signals 25 may be obtained from a timing pulse signal generator 6 connected to a pair of terminals 34 which are in turn connected with the primary winding 28.

A pulse forming network 35 causes essentially square wave pulses to be generated when the thyratron is triggered. One terminal 36 of the pulse-forming network is connected to the plate 12 and another terminal 37 is connected through a load resistor 38 to a point of reference potential or ground. A negative voltage pulse 40 is derived across the resistor 38 when the thyratron is triggered.

A pulse-forming network 35 is illustrated as comprising three cascaded pi-sections of lumped capacitors and inductors, i.e., three series connected inductors 42, 43 and 45 and shunt capacitors 47, 49, 51 and 53. The number of reactive elements utilized in the network depends upon the shape of the output pulse that is desired. Increasing the number of elements will provide more nearly square output pulses. Alternatively, the pulse-forming network may be formed of a section of transmission line, which the lumped constant network 35 actually approximates.

The output terminal 37 of the pulse-forming network is connected through a radio-frequency choke coil 41 to a control grid 44 of a power amplifier tetrode 46 for applying negative operating pulse voltages thereto. The tetrode 46 further includes a cathode 48, a screen grid 50 and a plate electrode 52. The cathode 48 is connected directly to ground. The positive voltage pulse 24 generated across the cathode resistor 22 of the thyratron is applied directly to the screen grid 50 of the tetrode to supply operating voltage thereto. A capacitor 56 is connected between the screen-grid 50 and ground to bypass radio-frequency signal voltage from the screen-grid.

Radio-frequency carrier excitation signals which are to be amplified are applied to the control grid 44 of the tetrode 46 from a tank circuit 58. One terminal of a blocking capacitor 60 is connected to the control grid 44 and the other terminal is connected to one end of a secondary winding 62 of an input transformer 58. The input transformer also includes a primary winding 68. A variable capacitor 64 connected in parallel with the secondary winding 62 tunes the input transformer. A pair of terminals 66 are connected to the primary winding 68 of the input transformer 58. Radio-frequency drive signals are applied to the terminals 66 and are thereupon coupled to the control grid 44 of the tetrode power amplifier.

In order to obtain the high power output for which a circuit of this type is particularly useful, pulse voltages are synchronously applied to the plate 52, control-grid 44 and screen grid 50 of the tetrode 46. A positive voltage pulse 70 provides operating plate voltage for the tetrode with the pulses 24 and 40 providing the operating voltage for the screen grid and control grid respectively. The pulse 70 is applied to a terminal 72 which is connected to the plate of the tetrode through a series connected radio-frequency choke coil 74. Output signals are obtained from a tank circuit comprising a transformer 78 having a primary winding 80 and a secondary winding 82. One terminal of the primary winding 80 is directly connected through a blocking capacitor 76 to the plate 52, and another terminal is connected to ground. To tune the output circuit a capacitor 83 is connected in parallel with the winding 80. A pulsed radio-frequency output signal is then obtained from a pair of output terminals 84 connected to the respective ends of the secondary winding 82.

In operation, a series of positive trigger pulses, one of which is illustrated at 25, are applied to the grid 14 of the thyratron 10. In the interval between pulses the thyratron is non-conducting and the pulse-forming network 35 charges to a high voltage, nominally +E*bb*, but with the rate of charging being kept comparatively low by the series charging choke 20. When a positive pulse 25 is applied to the grid 14, the thyratron triggers to a high conducting, low impedance condition, thereupon effectively connecting terminal 36 of the pulse-forming network directly to the ungrounded end of the cathode resistor 22. The energy stored in the pulse-forming network thereupon discharges into the resistors 22 and 38, simultaneously generating the pulses 24 and 40. The positive pulse 40 is applied to the screen grid 50 to provide screen-grid operating potential, and the negative pulse 40 is applied to the control grid 44 to provide the proper control-grid bias for the amplifier. Note that the pulses 24 and 40 are the only sources of operating potential for the control grid and screen grid electrodes, and that fixed grid bias supplies are not required. Simultaneous with this action, the plate energizing pulse voltage 70 is applied to the plate electrode 52. All of these events must occur in synchronism. Although the generator for the pulse 70 is not shown, it may be of the same general type as the screen pulse generator, and may be driven from the same source, thus providing the proper synchronism. Alternately, control-grid bias, screen-grid and plate voltages may be obtained from the same pulser stage, if it has sufficiently high voltage and power ratings. These three pulses provide the operating potentials for the tetrode power amplifier. During the interval that the operating potentials are applied, the radio-frequency carrier input signal is amplified, appears at the output of the transformer 78, and is coupled to the antenna 7. It should be understood that other types of pulser circuits may be employed other than the bootstrap, line type pulser illustrated, without departing from the scope of the invention.

High power amplifiers, are normally operated class-B or class-C, and generally employ fixed control-grid bias. Fixed grid bias circuits have the advantage of preventing excessive tube dissipation in case carrier excitation is lost, but have the disadvantage of requiring the use of a separate bias supply. By eliminating the fixed bias supply, the system described heretofore simplifies the amplifier circuitry and improves the circuit reliability.

Circuit reliability and stability of operation are also improved in the described circuit by reducing the tendency toward flash-arcing or voltage breakdown within the power amplifier tetrode 46. One of the factors which influences flash-arcing is the voltage gradient existing between the various tube electrodes. Since the control grid 44 is usually very close to the cathode 48, and especially so in the case of tubes designed for high frequency use, the grid-to-cathode voltage gradient is very high. It is particularly high in vacuum tubes used in high power applications, since high grid-to-cathode voltages are required. Therefore, a definite tendency has been found for the control grid to flash-arc to the cathode in the presence of continuously applied grid-to-cathode voltages. Since the control grid bias voltage is applied only for short intervals of time, and fixed bias is not used, the tendency towards flash-arcing is reduced.

The circuit shown in Figure 2 was successfully constructed and operated utilizing an RCA type 6952 tetrode power amplifier tube and a type 5*c*22 thyratron pulser tube. The direct current operating voltage +E*bb* applied to the thyratron 10 through the charging choke 20 was approximately 2100 volts, and pulsed operating voltages of 2000 volts and −250 volts were derived therefrom for the screen-grid and control-grid electrodes respectively of the power amplifier tube 46. Simultaneously, a voltage pulse of approximately 30,000 volts was applied to the plate electrode 52 of the power amplifier tube 46. The 30,000 volt pulse was derived from another pulser stage, similar in design to that shown in Figure 2, which utilized a type 1257 thyratron tube therein with a plate operating potential of approximately 30,000 volts. This clearly demonstrates the desirability of the pulse system of the invention heretofore described.

In the pulser circuit, the ratio of the resistors 22 and 38 should be designed to provide the proper operating voltages on the control and screen grids. For example, if the amplifier is to be operated class-B, it is necessary to provide sufficient control grid bias to effectively cut-off the tube in the absence of grid drive. This requires selecting the values of the resistors 22 and 38 to obtain the desired operating electrode voltages for class-B operation. For example, if the tetrode is assumed to have a screen grid amplification factor of 8, then the resistor 22 should be eight times the resistance of the resistor 38 as a first approximation.

A further advantage in supplying the screen and control grid regions from a common source, such as the pulser stage 5, is that the system is self-compensating in event of supply voltage changes. For example, if the pulsed screen grid voltage of the tetrode 46 increases, a simultaneous increase in pulsed grid bias voltage occurs, thereby maintaining the required ratio of screen-to-control grid voltages. Another advantage is that only the voltage +E*bb*, applied to the thyratron pulser tube 10, need be varied in order to simultaneously vary the screen-grid and control-grid bias voltages in the proper ratio. This simplifies the changing of operating conditions in the power amplifier. Line voltage variations are also self-compensating by this means.

Still a further advantage in using the described system is in the area of fault protection. In conventional amplifiers employing fixed control-grid bias supplies, large filter capacitors are normally used in the bias supply circuits to improve voltage regulation. However, in the event of a grid-to-cathode fault, with resulting flash arcing, these capacitors discharge into the fault, thereby increasing tube damage. In the system of the invention, the amount of stored energy available for this purpose is minimized. If a grid-to-cathode fault develops during the application of energizing control-grid bias pulses to the tube, the only energy available for damaging the tube is that within the pulse itself, and this is much smaller than the energy available from a fixed grid-bias supply. Additionally there is a self-regulating mechanism which operates in the event of grid-to-cathode flash arcing. When arcing occurs, the control-grid bias is lost, thereby increasing the screen-grid current drawn from the pulser stage. This tends to accelerate the dissipation of the energy stored in the common pulse source thereby minimizing the amount of damage that might be done to the amplifier tube.

Although this system has been shown to be particularly useful for pulsing tetrode type tubes, it should be understood that it can be applied equally well to pentode type tubes.

There has thus been shown and described a novel and improved system for operating multigrid type vacuum tubes in pulsed radio-frequency amplifier circuits. By simultaneously applying pulse type operating voltages to all of the electrodes in the multigrid tube, operating stability and tube reliability are improved, a separate control-grid bias supply is eliminated, and circuitry is simplified.

What is claimed is:

1. In a circuit for producing high power radio-frequency pulses the combination comprising, an amplifier stage including an electron tube having a plate electrode, a screen-grid electrode and a control-grid electrode, means for applying a radio-frequency signal to said control-grid electrode, means for synchronously applying positive pulse voltages to said plate and screen-grid electrodes and negative pulse voltages to said control-grid electrode, said negative control-grid pulse voltages establishing operating bias for said electron tube.

2. A circuit for producing high power radio-frequency pulses comprising in combination, a pulser stage and an amplifier stage, said pulser stage including a thyratron type electron tube having a plate, a cathode, and a control electrode, a charging reactor connected between the plate electrode of said thyratron and a source of operating potential, a pulse forming network and a first resistor serially connected between said plate and a point of reference potential, a second resistor connected between said cathode and a point of reference potential, means providing input signals to said control electrode whereby a positive voltage pulse is obtained across said second resistor and a negative voltage pulse is obtained across said first resistor, an amplifier stage including an electron tube having a plate, a control-grid and a screen-grid, means for applying a radio-frequency input signal to said control grid, means for applying said positive voltage pulse to said screen-grid and said negative voltage pulse to said control-grid, terminal means for applying a positive voltage pulse to said plate in synchronism with said screen and control-grid voltage pulses, and output means for providing an amplified radio-frequency pulse signal.

3. A circuit for producing high power radio-frequency pulses comprising in combinaton, a pulser stage and an amplifier stage, said pulser stage comprising charge storage means which is charged from a direct-current source, means for repetitively discharging said storage means and for producing repetitive positive pulse voltages with respect to a reference point and for simultaneously producing repetitive negative pulse voltages with respect to said reference point, said amplifier stage comprising an electron tube having a plate electrode, a screen-grid electrode and a control-grid electrode, means for applying a radio-frequency signal to said control-grid electrode, means for applying said positive pulse voltages to said screen-grid electrode and said negative pulse voltages to said control-grid electrode, and means for applying to said plate electrode other positive pulse voltages which are synchronous with the said pulse voltages produced by said pulser stage, said negative control-grid pulse voltages establishing operating bias for said electron tube.

4. A circuit for producing high power radio-frequency pulses comprising in combination, a pulser stage and an amplifier stage, said pulser stage comprising charge storage means which is charged from a direct-current source, a resistive load circuit, means for repetitively discharging said storage means through said load circuit to produce repetitive positive pulse voltages at a point on said load circuit with respect to a reference point thereon and to produce repetitive negative pulse voltages at another point on said load circuit with respect to said reference point, said amplifier stage comprising an electron tube having a plate electrode, a screen-grid electrode and a control-grid electrode, means for applying a radio-frequency signal to said control-grid electrode, means for applying said positive pulse voltages to said screen-grid electrode and said negative pulse voltages to said control-grid electrode, and means for applying to said plate electrode other positive pulse voltages which are synchronous with the said pulse voltages produced by said pulser stage, said negative control-grid pulse voltages establishing operating bias for said electron tube.

References Cited in the file of this patent

UNITED STATES PATENTS 2,224,690 Moodey et al. ---------- Dec. 10, 1940
2,432,720 Brown --------------- Dec. 16, 1947